United States Patent [19]
Behrens et al.

[11] Patent Number: 5,359,631
[45] Date of Patent: Oct. 25, 1994

[54] TIMING RECOVERY CIRCUIT FOR SYNCHRONOUS WAVEFORM SAMPLING

[75] Inventors: Richard T. Behrens, Louisville; Trent Dudley, Littleton; Neal Glover, Broomfield, all of Colo.; David R. Welland, Austin, Tex.

[73] Assignee: Cirrus Logic, Inc., Fremont, Calif.

[21] Appl. No.: 954,350

[22] Filed: Sep. 30, 1992

[51] Int. Cl.$^5$ ............................................... H03D 3/24
[52] U.S. Cl. ................................. 375/120; 375/118; 329/307; 329/325; 331/1 A; 331/25
[58] Field of Search .................. 375/118–120; 329/307, 325; 331/1 R, 10, 23, 25, 1 A

[56] References Cited

U.S. PATENT DOCUMENTS

| | | | |
|---|---|---|---|
| 4,416,017 | 11/1983 | Jasper et al. | 375/99 |
| 4,609,907 | 9/1986 | Adler et al. | 375/18 |
| 4,890,299 | 12/1989 | Dolivo et al. | 375/18 |
| 5,068,628 | 11/1991 | Ghoshal | 331/1 A |
| 5,216,554 | 6/1993 | Schneider | 375/120 |

OTHER PUBLICATIONS

Dolivo, F., Schott, W., Ungerböck, G. "Fast Timing Recovery for Partial-Response Signaling Systems", Published in the Proceedings of the 1989 ICC Conference (IEEE).

Cideciyan, R., Dolivo, F., Hermann, R., Hirt, W., Schott, W., "A PRML System for Digital Magnetic Recording", *IEEE*, Log Number 9104232, 1992.

Lyon, D. L., "Timing Recovery in Synchronous Equalized Data Communication", *IEEE Transactions on Communications*, pp. 269–274, Feb. 1975.

Jennings, A. and Clarke, B. R., "Data-Sequence Selective Timing Recovery for PAM Systems", *IEEE Transactions on Communications*, vol. Com-33, #7, pp. 729–731, Jul. 1985.

Saltzberg, B. R., "Timing Recovery for Synchronous Binary Data Transmission", *The Bell System Technical Journal*, pp. 593–622, Mar. 1967.

Fagan, A. D. and O'Connor, R. E., "Measurements on the Timing Recovery Performance of Partial-Response Class-4 Signalling", *IEEE Proceedings*, vol. 136, #4, pp. 254–258, Aug. 1989.

Mueller, K. H. and Müller, M., "Timing Recovery in Digital Synchronous Data Receivers", *IEEE Transactions on Communications*, vol. Com-24, No. 5, pp. 516–531, May 1976.

Qureshi, Shahid U. H., "Timing Recovery for Equalized Partial-Response Systems", *IEEE Transactions on Communications*, pp. 1326–1331, Dec. 1976.

Lee, E. A. and Messerschmitt, D. G., "Timing Recovery", *Digital Communication*, Kluwer Academic Publishers, Boston, 1988, Chapter 15, pp. 560–586.

Abbott, W. L. and Cioffi, J. M., "Timing Recovery for Adaptive Decision Feedback Equalization of the Magnetic Storage Channel", Proceedings of IEEE Global Telecommunications Conference (Globecom), San Diego, Calif., 1990.

*Primary Examiner*—Stephen Chin
*Assistant Examiner*—Young Tse
*Attorney, Agent, or Firm*—James R. Young

[57] ABSTRACT

A timing circuit having an analog to digital converter to sample an analog signal, a controlled oscillator for controlling sample times of the analog to digital converter, a circuit to detect pulses in the analog signal, a phase error circuit to subtract one of two samples from the other to create a phase error measurement and a frequency error circuit to add two samples together to create a frequency error measurement. The two samples are taken from either side of a pulse. The phase error measurement is used by the controlled oscillator to adjust the sample timing to take samples at desired locations on the pulse. The circuit also contains constant values used to compensate for the pulse being asymmetrical and to compensate for other pulses that occur close to the detected pulse. The circuit also inserts a known frequency in place of the analog signal to establish a frequency of the controlled oscillator.

15 Claims, 12 Drawing Sheets

TIMING RECOVERY CIRCUIT FOR SYNCHRONOUS WAVEFORM SAMPLING

CROSS REFERENCE TO RELATED APPLICATIONS

This application is related to application Ser. No. 07/852,015, filed Mar. 16, 1992, of Richard T. Behrens, Kent D. Anderson and Neal Glover, entitled "Method and Apparatus for Reduced-Complexity Viterbi-Type Sequence Detectors", now U.S. Pat. No. 5,291,499, and application Ser. No. 07/879,938, filed May 8, 1992, of Richard T. Behrens, Trent Dudley, and Neal Glover, entitled "Digital Pulse Detector", both owned by the same entity.

FIELD OF THE INVENTION

This invention relates to computer systems and more particularly to data storage and data communication devices within such computer systems. Even more particularly, the invention relates to apparatus for recovering a synchronized clock signal from an analog waveform being read from a recording medium of a data storage device or being received from a data communication device.

BACKGROUND OF THE INVENTION

In a magnetic disk or tape data storage device, data is commonly stored on a magnetic medium by saturation recording in which each portion of the medium is magnetized to the point of saturation in one of two directions. The data to be stored is typically encoded to satisfy certain constraints and the encoded data is used to modulate the direction of magnetization. In a coded representation known as NRZI, each "one" bit of the encoded data causes a transition in the direction of magnetization, while each "zero" bit of the encoded data causes the magnetization direction to remain unchanged. A clock signal is used to write a sequence of encoded NRZI bits as a recording head moves along a track on the medium such that one bit is written at each clock tick.

When a read head is passed over the recorded data track, a voltage pulse is produced at each transition in magnetization. Successive voltage pulses have opposite polarity since successive magnetic transitions are in opposite directions. The written NRZI data sequence may be reconstructed from the resulting voltage waveform by associating a "one" bit with every clock tick at which a pulse occurs and a "zero" bit with every clock tick at which no pulse occurs. The original user data may then be decoded from the NRZI data.

Similar waveforms composed of pulses sometimes occur in other applications, including data storage on optical media and data communications via modem, network, radio, or fiber-optic link.

To recover the written or transmitted data sequence, the receiver requires a clock signal synchronized with the received waveform. At each tick of this synchronized clock signal the receiver or read circuitry generates one bit of the NRZI data sequence by processing the surrounding waveform. It is often impossible or at least undesirable to store or transmit a separate synchronized clock signal with the data waveform. Instead, constraints are applied to the encoded NRZI data sequence to ensure that timing information may be extracted from the data waveform itself and used to "recover" a synchronized clock signal. Such a system is referred to as "self clocking".

Prior art magnetic disk drives typically use a data detection system known as peak detection, in which analog circuitry determines the time instant of each peak in the waveform. Peaks that meet a qualification requirement, such as exceeding a threshold amplitude, are considered to have been caused by a magnetic transition and are therefore associated with an NRZI "one" bit. The recovered clock divides the waveform into bit cells or windows where the nominal position of a peak is at the center of a window. A "one" bit is output for each window that contains a qualified peak and a "zero" bit is output for each other window. The phase and frequency of the recovered clock are adjusted in a phase locked loop so as to keep the windows properly aligned with the peaks.

Inter-symbol interference (ISI) occurs when pulses are placed so close together in a waveform that they overlap significantly. The position of a peak in a waveform can be shifted by ISI from other nearby pulses. Thus the recording density of a peak detection channel is limited by the fact that ISI must not be permitted to move a peak from one window to another. Peak shift due to ISI also causes apparent timing errors that affect the performance of the clock recovery circuit.

To achieve higher recording densities and/or greater noise immunity than peak detection channels, another class of detection methods is based on amplitude sampling of the signal waveform. Many such sampling detection methods can be implemented using either analog or digital signal processing devices. In either case, a synchronized clock signal is required to control the sample timing and a means must be provided to recover such a clock signal from the data waveform. Thus there is a need for new timing recovery methods suitable for use with sampled amplitude detectors at high recording densities. The present invention meets this and other needs.

This Application is related to U.S. Pat. No. 5,291,499, and application Ser. No. 07/879,938, filed May 8, 1992, of Richard T. Behrens, Trent Dudley, and Neal Glover, entitled "Digital Pulse Detector", both owned by the same entity. Each of these applications is incorporated herein by reference for all that is disclosed and taught therein.

SUMMARY OF THE INVENTION

It is an aspect of the present invention to detect signal pulses caused by bit transitions within data being read from a data storage device or data communications device.

It is an aspect of the invention to measure a phase error between each pulse in a signal waveform and a clock signal used to sample the waveform.

It is another aspect of the invention to compensate the phase error measurement for asymmetry of the pulse being detected and to compensate for nearby pulses.

It is another aspect of the invention to adjust the frequency, and thereby the phase of the clock signal so as to drive the phase error measurement toward zero.

It is another aspect of the invention to measure a frequency error between a fixed frequency pulse train and a clock signal used to sample the pulse train and adjust the frequency of the clock signal so as to drive the frequency error measurement toward zero.

The above and other aspects of the invention are accomplished in the preferred embodiment in a mixed analog and digital timing circuit for timing the conversion of an analog signal to a digital signal. The circuit has an analog to digital converter for converting the analog signal to digital sample values at controlled sampling times, and a variable frequency oscillator for controlling when the analog to digital converter performs the conversion. A pulse detector detects pulses in the digitized signal. A phase error circuit subtracts one of two sample values for each pulse from the other to create a digital phase error measurement value. The two sample values occur on either side of the peak of the pulse detected by the pulse detector. The digital phase error measurement value is filtered using a digital filter whose output is connected to the variable frequency oscillator to adjust the sample timing to cause samples to be taken at the desired time instants.

The system also contains a set point register that contains a value used to adjust the desired sample phase. The set point may be used to compensate for the pulse being asymmetrical. This value is always added to the digital phase error measurement value.

In addition to the set point register, the system contains compensation registers for pulses that occur at two sample times on either side of the detected pulse, since these pulses are close enough to the detected pulse to change its shape. These values are only added into the digital phase error value if a pulse is also detected at these sample times. A third compensation register is also present for pulses that occur three sample times after the detected pulse, and the value of this register is added to the digital phase error value if this pulse is detected.

The system also contains a lock to reference mode that includes synthesizing a fixed frequency data pattern, inserting the data pattern in place of the read signal and locking the variable frequency oscillator to the synthesized frequency.

BRIEF DESCRIPTION OF THE DRAWINGS

The above and other aspects, features, and advantages of the invention will be better understood by reading the following more particular description of the invention, presented in conjunction with the following drawings, wherein.

DESCRIPTION OF THE PREFERRED EMBODIMENT

The following description is of the best presently contemplated mode of carrying out the present invention. This description is not to be taken in a limiting sense but is made merely for the purpose of describing the general principles of the invention. The scope of the invention should be determined by referencing the appended claims.

Figure 1:
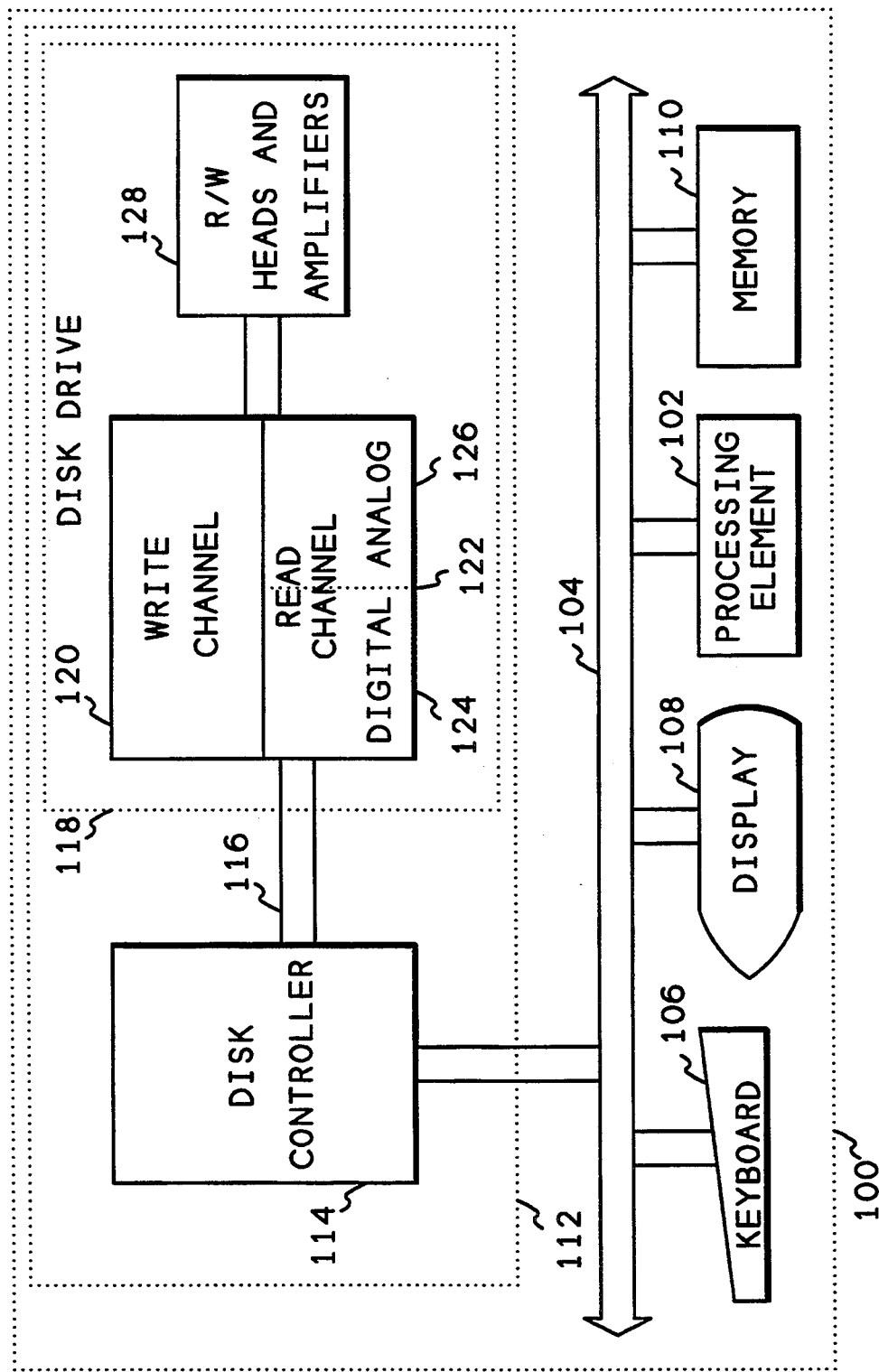
FIG. 1 shows a block diagram of the environment of the invention and illustrates the read channel that contains the invention.

FIG. 1 shows a block diagram of a typical environment of the invention. Referring now to FIG. 1, a computer system 100 contains a processing element 102 which communicates to other elements of the computer system 100 over a system bus 104. A keyboard 106 and a display 108 allow a user of the computer system 100 to communicate with the computer system 100. A memory 110 contains programs and data which cause the computer system 100 to perform operations desired by the user.

A disk data storage system 112 is connected to the system bus 104 for storing data and programs within the computer system 100. A disk controller 114 within the disk device 112 communicates to the system bus 104 and controls the operations of a disk drive 118, possibly in conjunction with a local microprocessor (not shown) within the disk data storage system 112. The disk drive 118 performs the storage function, typically storing the data on magnetic media. A bus 116 connects the disk controller 114 to the disk drive 118, specifically connecting to a write channel 120 to write data onto the disk through write heads and amplifiers 128. When data is being read from the disk through the read head and amplifiers 128 the data comes back through the read channel 122 which contains the timing recovery circuit of the present invention. The read and write heads may be physically the same heads. The data first passes through the analog section 126 of the read channel 122 and then through the digital section 124 of the read channel 122 before being sent on the bus 116 to the disk controller 114. After being processed by the disk controller 114, the data is then sent over the system bus 104 to the memory 110 and/or the processing element 102.

The disk controller 114 also connects to other circuits, not shown, within the disk drive 118, such as a circuit which moves the read/write heads over the surface of the data storage media.

Although not shown in FIG. 1, the digital timing circuit of the present invention can be used for synchronizing a clock to pulses within data received from a transmission line, such as a telephone line or local area network, in a data communications receiver. It may also be used in any other device that must time and detect pulses within a signal.

Figure 2:
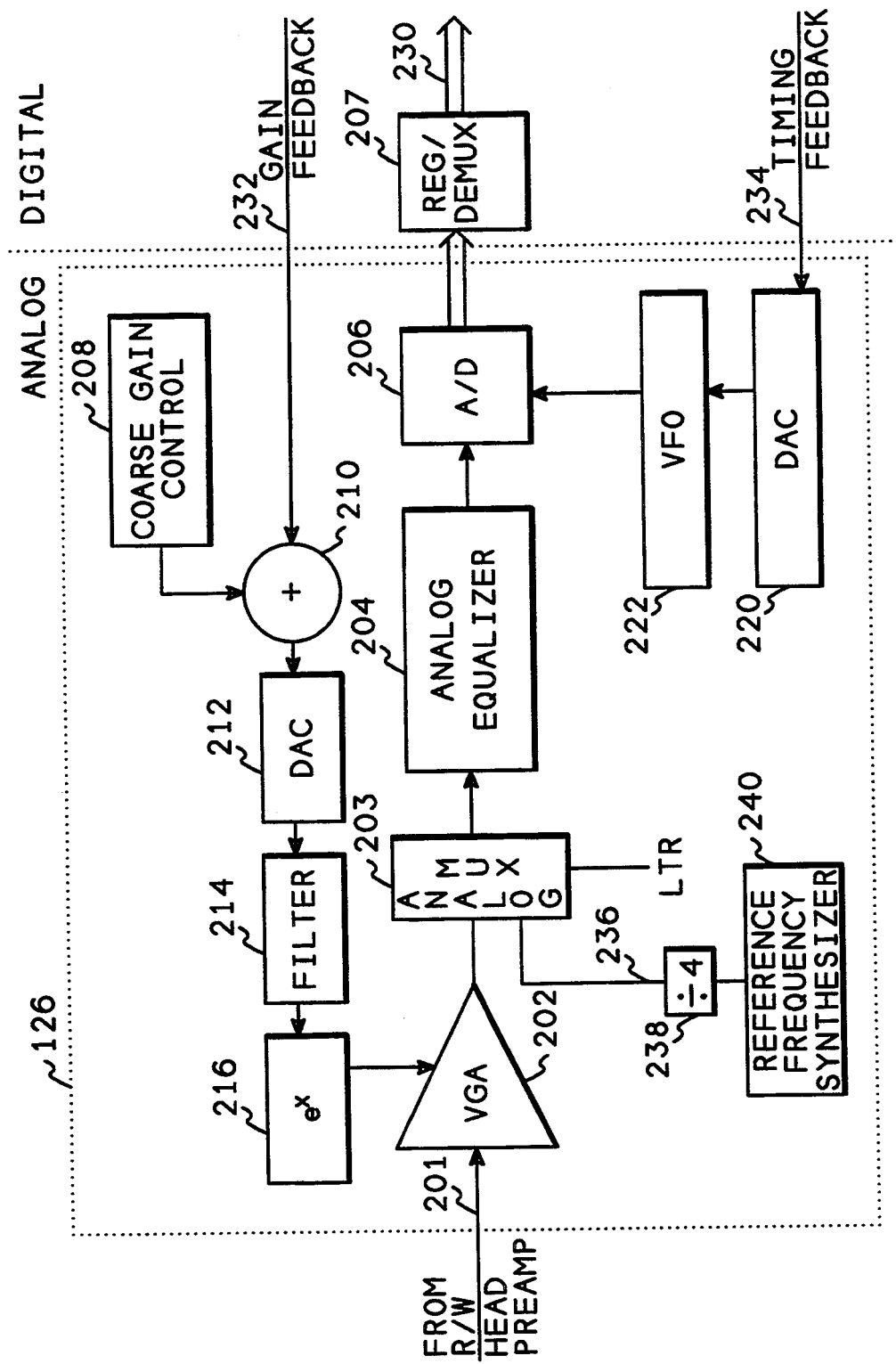
FIG. 2 shows a block diagram of the analog and analog to digital conversion circuitry of the read channel containing the invention.

FIG. 2 shows a block diagram of the analog circuitry 126 of the read channel 122. Referring now to FIG. 2, when a read head is passing over a track of the data storage medium, it picks up a signal which is amplified by a preamplifier, not shown. After this preamplification, the signal 201 is passed to a variable gain amplifier 202. The signal is further amplified by the variable gain amplifier 202 and passed through an analog multiplexer 203 and then to an analog equalizer circuit 204, which filters the signal as desired, for example, so as to remove unwanted high frequencies and shape the remaining spectrum, to an Analog to Digital (A to D) converter 206. The A to D converter 206 converts the analog signal into a sequence of digital values, providing six bits of digital information per sample in the preferred embodiment, and then the data is passed to a register/de-multiplexer 207. In the preferred embodiment, the digital section 124 of the read channel 122 processes two samples in parallel. To create these two samples, the register/de-multiplexer 207 stores every other sample taken by the A to D converter 206. After the second sample is taken, the data from the two samples is passed to the data bus 230. The bus 230 is clocked by a single half-frequency clock signal.

The timing necessary for converting the data, also called taking a sample, in the A to D converter 206 is supplied by a variable frequency oscillator 222 which is controlled by the output of a digital to analog converter (DAC) 220. The input to the DAC 220 comes from the digital section of the read channel 124 as timing feedback signal 234. Alternatively, the DAC 220 may be an integral part of the variable frequency oscillator in such a way that the digital input controls the frequency directly.

A reference signal 236 is created by a frequency synthesizer 240 running at the frequency used for writing data, and dividing this frequency by four in the divide by four circuit 238. The output of the divide by four circuit 238 is a square wave with period 4T which is connected to the analog multiplexer 203. The filter 204 passes the fundamental frequency of the square wave but rejects the higher harmonics, thus converting the reference signal into a sinusoid with frequency 1/4T. This sinusoidal reference signal is equivalent to the data signal typically produced by alternating transitions and spaces, i.e. 101010... in NRZI representation. It is often called a "2T" pattern because the distance between transitions is 2 bit cells. The 2T pattern is a pulse pattern often used for a preamble signal at the start of a data record. The reference pattern signal 236 is used to set the VFO 222 to a nominal frequency before locking to data preamble.

The gain of the variable gain amplifier 202 is controlled through a gain feedback signal 232 which originates in the digital portion 124 of the read channel 122. The gain feedback signal 232 is input to a summing junction 210 which has a coarse gain control value as its other input. The coarse gain control can be set by the disk controller 114, or a local microprocessor (not shown) within the disk drive, to provide a nominal gain level which is then adjusted up or down by the gain feedback signal 232. After being summed with the coarse gain control value, the feedback signal is sent to a digital to analog converter 212 and then to a filter 214. Because of the nature of many digital to analog converters, the output of the DAC 212 may contain glitches when it is changing values. Therefore, the filter 214 may be necessary to remove these glitches in the feedback signal. After being filtered, the signal is exponentiated by the exponential converter block 216 and then connected to the variable gain amplifier 202. This conversion makes the small-signal gain control dynamics independent of the input signal amplitude.

Figure 3:
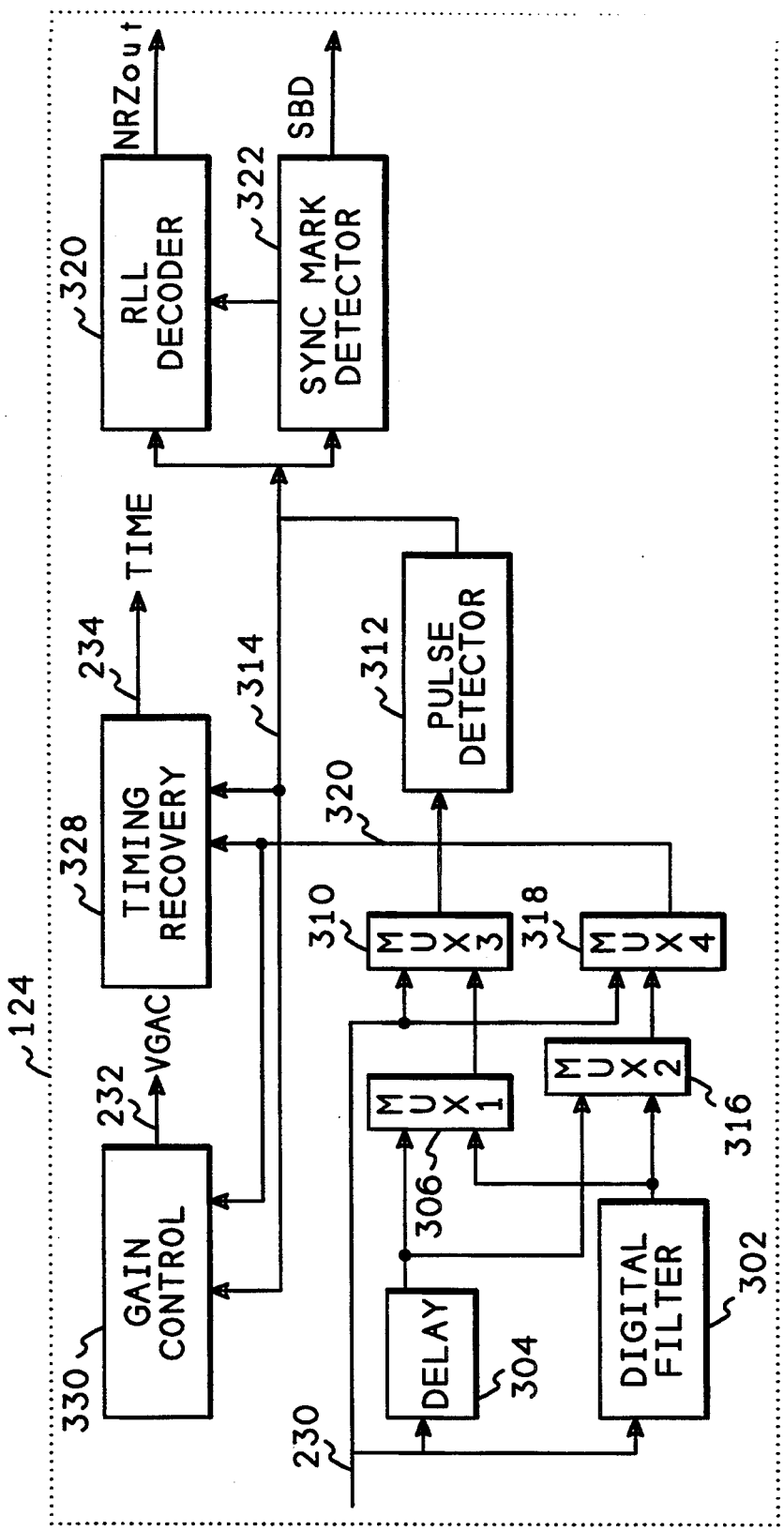
FIG. 3 shows a block diagram of the digital circuitry of the read channel containing the invention.

FIG. 3 shows a block diagram of the digital section 124 of the read channel 122 (FIG. 1). Referring now to FIG. 3, the digital data signal 230 from FIG. 2 is input to a delay circuit 304 and a digital filter circuit 302. The outputs of these two circuits are connected to multiplexers 306 and 316, whose outputs are connected to multiplexers 310 and 318 respectively. Multiplexers 310 and 318 also receive signal 230. Multiplexers 306 and 316 may be selected independently, however, multiplexers 310 and 318 are always selected together. In this manner, either the digital data signal 230 or the filtered/delayed signals may be selected for input to both a pulse detector 312 and a timing recovery circuit 328. If the filtered signal is selected for either the pulse detector 312 or the timing recovery 328, either the filtered signal or the delayed signal must be selected for input to the other of these circuits. The filter 302 inserts a delay into the digital data signal 230, so if one circuit selects the filtered signal, the other circuit input must be delay compensated by selecting the delayed signal from circuit 304 or by also selecting the filtered signal from filter 302.

One circuit suitable for use as the pulse detector 312 is disclosed in U.S. patent application Ser. No. 07/879,938.

The output of the pulse detector 312 is connected to a gain control circuit 330 which provides the gain feedback signal 232 that connects to FIG. 2. The output of the pulse detector 312 is also connected to the timing recovery circuit 328 whose output 234 connects to the digital to analog converter 220 of FIG. 2. The output of the pulse detector 312 may also be connected to a sync mark detector 322 and an RLL decoder 320, as shown in FIG. 3, or a more sophisticated data detector (not shown) may be connected to the sync mark detector 322 and the RLL decoder 320. The output of the RLL decoder 320 and the sync mark detector 322 are connected to the disk controller 114 (FIG. 1) through the bus 116.

Figure 4:
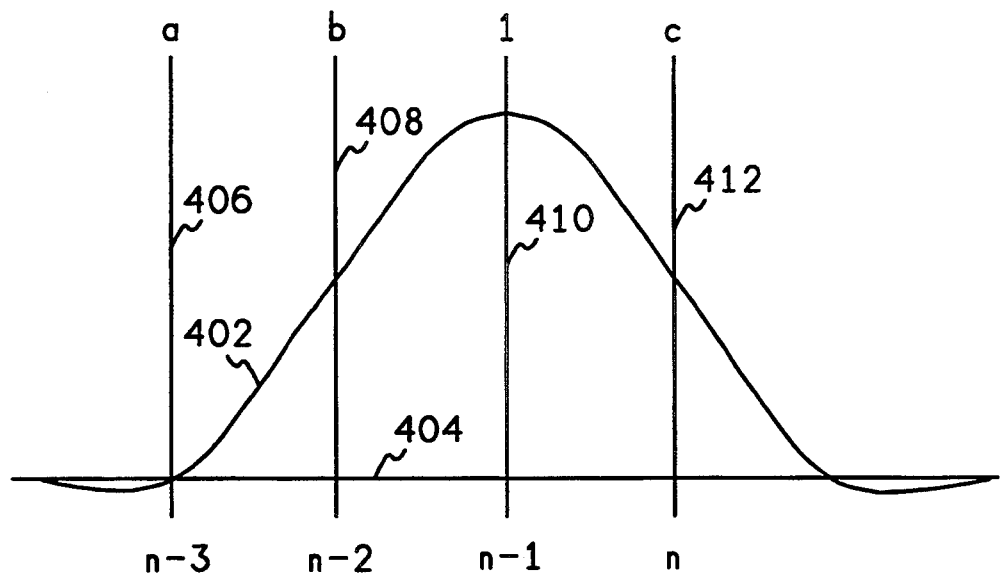
FIG. 4 shows a signal waveform and illustrates center sampling of the pulses.
Figure 5:
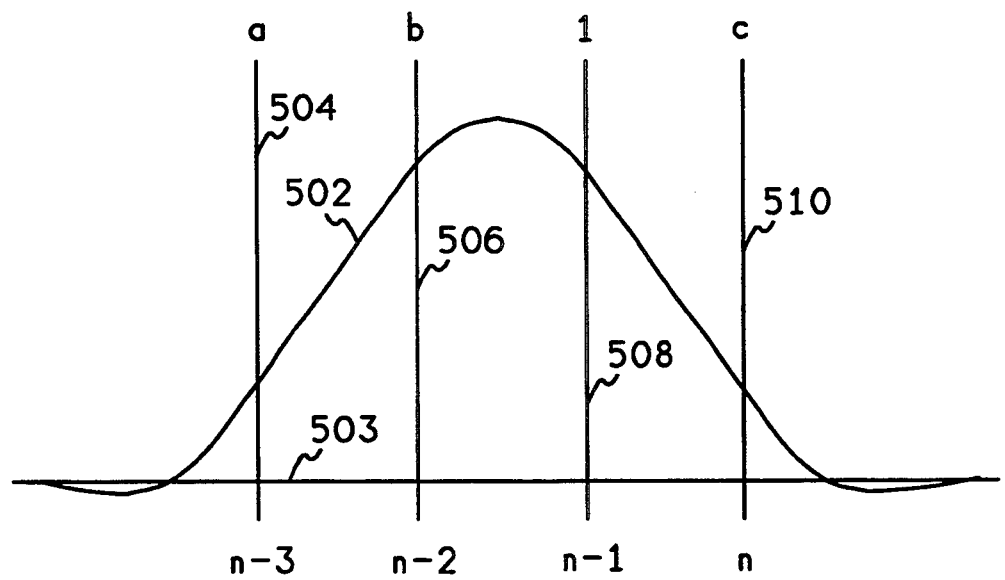
FIG. 5 shows a signal waveform and illustrates side sampling of the pulses.

The pulse detector 312 and the timing recovery circuit 328 are designed to process pulses using one of two types of sampling methods, selected by the user. The first sampling method is called center sampling wherein one of the samples taken will arrive at or near the center, or peak, of a pulse as shown in FIG. 4. The location of the sampling is controlled by the timing recovery block 328. In the other method of sampling, called side sampling, the timing recovery block 328 will adjust the timing of the VFO 222 (FIG. 2) such that two consecutive samples are taken wherein one of the two samples appears on one side of the peak of the pulse and the other of the two samples appears on the other side of the peak as shown in FIG. 5. The user of the system determines whether center sampling or side sampling is used by setting a bit in a control register through the interface 116 (FIG. 1).

For either center or side sampling, sampling can occur during two different time segments within a data record being read from the disk media. The first time segment sampling occurs is called acquisition mode, because it occurs when the gain control and timing control are acquiring the gain and timing relationships of the pulses. This occurs when the read head is passing a preamble portion of the data record which always has a known data pattern to facilitate acquisition of the timing and gain. When data is being transferred, a different mode is used for the pulse detector and timing recovery, called tracking, since data has an irregular and a priori unknown pattern of pulses.

Therefore, the pulse detector and timing recovery circuits are designed to process pulses under four separate conditions. The first condition is acquisition mode using side sampling, the second is acquisition mode using center sampling, third is tracking mode using side sampling, and fourth is tracking mode using center sampling.

The timing recovery circuit analyzes the current sample of the amplitude of the signal as well as the previous two samples of the signal amplitude. Using these three samples, Table 1 shows equations for the timing recovery circuit 328.

In Table 1, n is the time of the current sample, n−1 is the first previous sample, n−2 is the second previous sample and n−3 is the third previous sample. $y_x$ is the sample value for a sample taken at time x. SGN is the arithmetic sign of the sample value. $P_x$ has a value of 1 if a pulse is detected during sample x, and $P_x$ has a value of 0 is a pulse is not detected during sample x. $t_a$ is the acquisition timing set point, and $t_t$ is the tracking timing set point. a, b, and c are constants used to adjust for nearby pulses. The equations of Table 1 will be further described below. Also, the equations of Table 1 assume pulse detection at time n of a pulse whose peak occurs at time $y_{n-1}$ for center sampling, or between $y_{n-1}$ and $y_{n-2}$ for side sampling. The circuits of FIGS. 9–12 processes two signal samples simultaneously. The equations for the second sample are the same as the equations of Table 1, with one time delay. Thus, for example, $y_n$ in Table 1 would be replaced by $y_{n-1}$, $y_{n-1}$ would be replaced by $y_{n-2}$, and $y_{n-2}$ would be replaced by $y_{n-3}$.

FIG. 4 shows a signal waveform of an isolated pulse and illustrates center sampling of the pulse. Referring now to FIG. 4, a signal waveform 402 is shown having four samples taken with the sample identified by reference 412, at time n, being the most recent sample. Sample 410, at time n−1, is the sample just prior to the most recent sample, sample 408 is the next previous sample and sample 406 is the oldest of the four samples shown. Negative pulses would appear as a mirror image of FIG. 4. The samples taken of the pulse are also identified as "a", "b", "1", and "c". Sample "a" occurs at time n−3 of each pulse, sample "b" occurs at time n−2 of each pulse, sample "1", occurs at time n−1 of each pulse, and sample "c" occurs at time n of each pulse. The sample labeled "1" is so labeled because the gain circuit adjusts the level of this sample to a nominal value of 1.

FIG. 5 shows a signal waveform of an isolated pulse and illustrates side sampling of the pulse. Referring now to FIG. 5, a signal waveform 502 is shown as a positive level above a baseline 503. Four samples are shown, with the most recent sample being sample 510. Sample 508 is the sample previous to the most recent, 506 is the next previous sample and sample 504 is the oldest of the four samples shown. These samples are also identified by the time references n through n−3.

Figure 6:
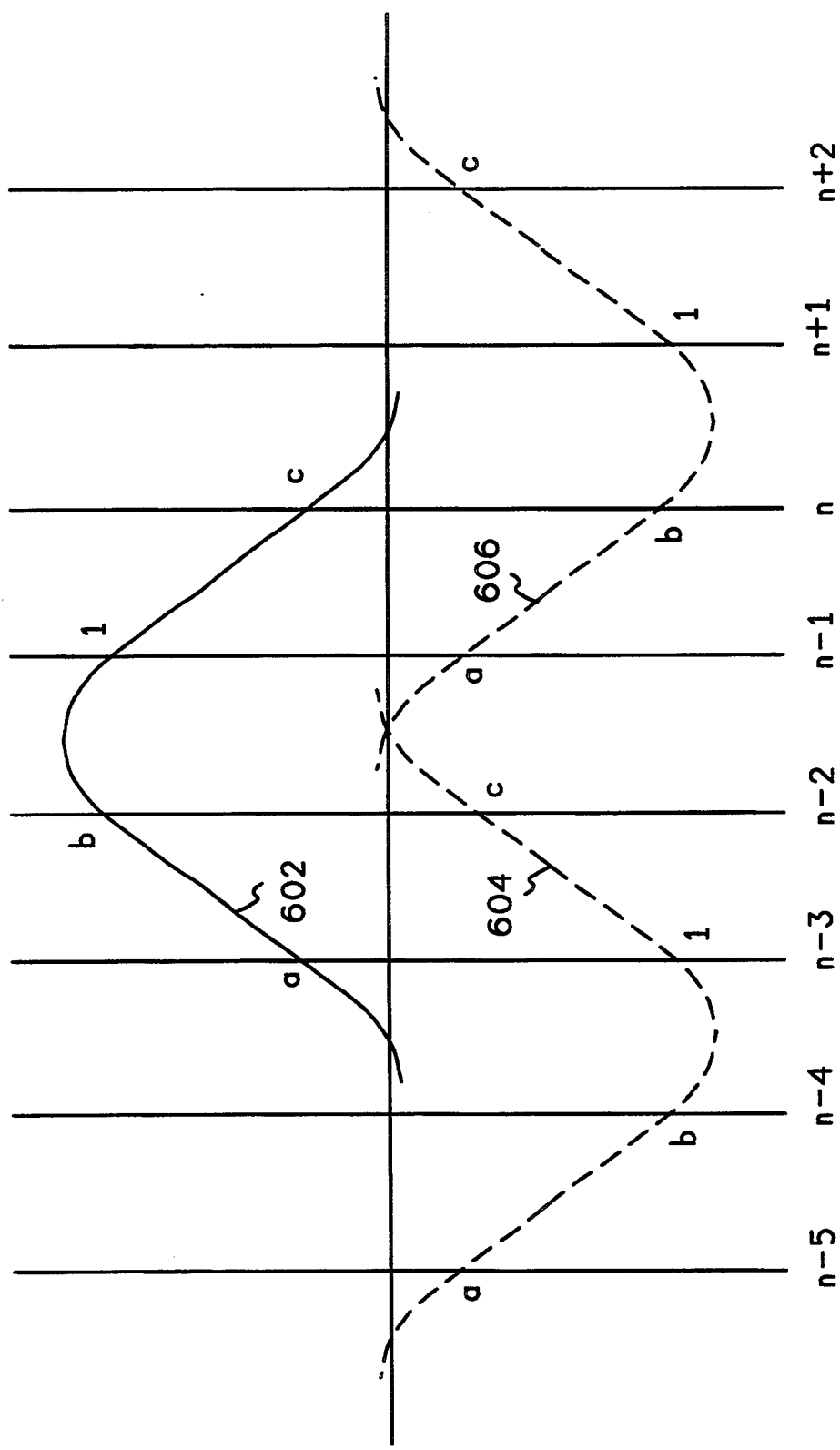
FIGS. 6 and 7 show signal waveforms to illustrate overlapping pulses.
Figure 7:
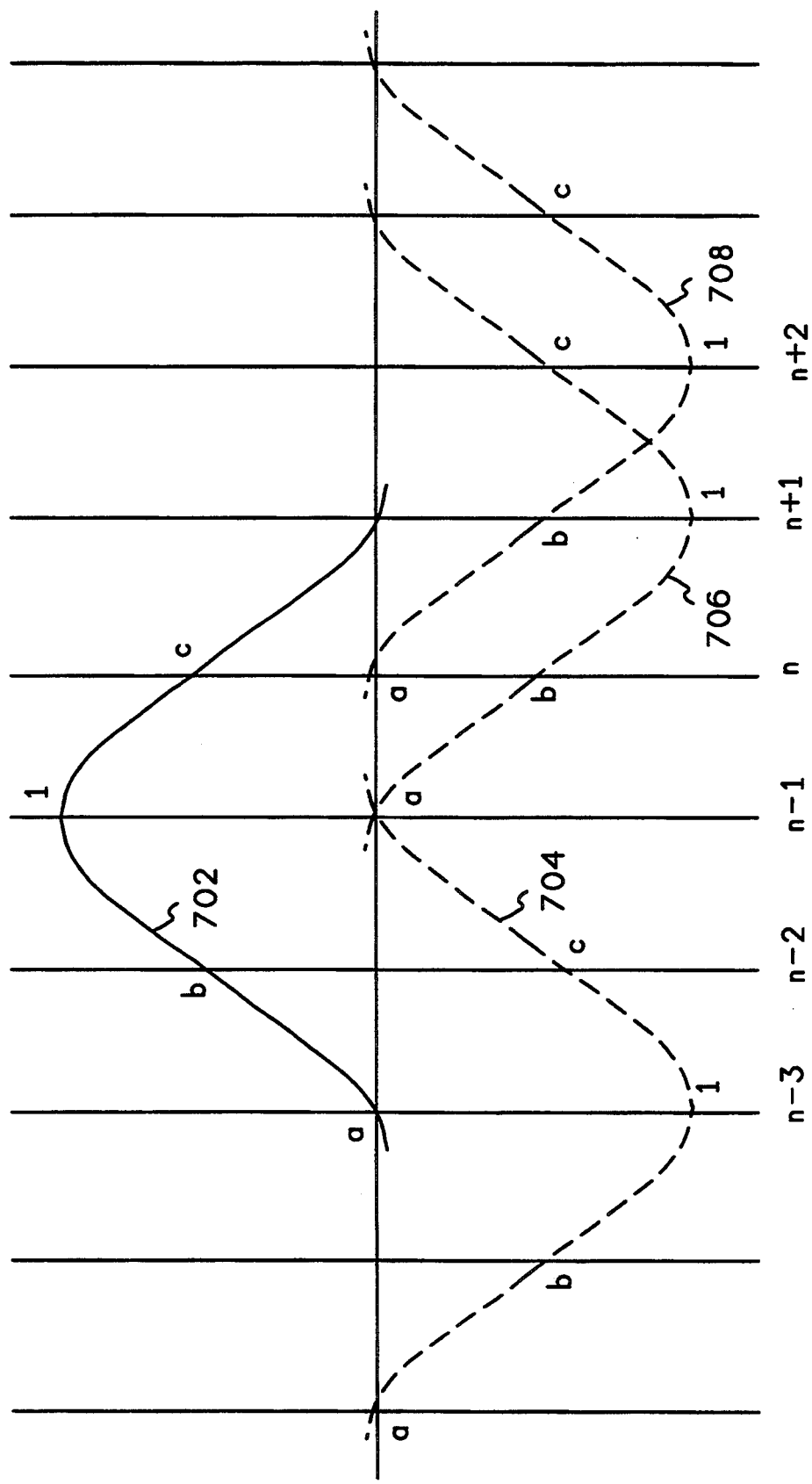

FIGS. 6 and 7 show waveforms and sample times for a typical pulse for side and center sampling, respectively and will be used to illustrate the equations shown in Table 1.

Referring now to FIG. 6, a waveform 602 is shown with side sampling mode, with the four samples of the waveforms, "a", "b", "1" and "c" being identified for the value of the waveform at sample times n−3, n−2, n−1, and n, respectively. Because of the type of data recording code being used, pulses can never occur at two successive sampling times, thus pulses must be separated by at least two sample times. Therefore, the pulse illustrated by dashed line 604 is the closest a pulse could occur prior to the pulse 602 and the pulse identified by dashed line 606 is the earliest another pulse could occur after the pulse 602.

Considering the side sample tracking equation of Table 1, if pulse 602 is a symmetric isolated pulse, that is, neither pulse 604 nor pulse 606 occurs, the phase error will be zero if the value of the sample taken at n−2, that is, the "b" sample, is equal to the value of the sample taken at n−1, that is, the "1" sample. This result is shown in the side sample tracking equation as $y_{n-2} - y_{n-1}$, where $y_x$ represents the sample value at time x. Since pulses can occur in both positive and negative directions, the sign of $y_{n-1}$ is multiplied into this equation to account for negative sample values. That is, the equation $$\text{SGN}(y_{n-1}) * (y_{n-2} - y_{n-1})$$

will give the phase error for a symmetric isolated pulse. This phase error will be zero if the peak of the pulse occurs exactly at the center between the "b" and "1" samples, and will be non-zero if the peak is offset from the center. If the peak is offset left of center, the "b" sample value will be higher than the "1" sample value, resulting in a positive phase error value, and if the peak is offset right of center, the "b" sample value will be lower than the "1" sample value, resulting in a negative phase error value.

There are many factors that may cause a pulse to be asymmetric, including magnetic, geometrical, and electronic factors. Because of this possible asymmetry, the term $t_t$ is introduced into the equation. The value for $t_t$ will be established by calibrating the device, however, Table 2 shows nominal values for $t_t$ for different types of data patterns used during acquisition. Therefore, the equation $$\text{SGN}(y_{n-1}) * (y_{n-2} - y_{n-1}) + t_t$$

gives the phase error equation for an isolated, possibly asymmetrical, pulse.

Since pulse 604 might have occurred two sample times earlier than pulse 602, the effects of this pulse must be considered in the equations. The term "+c * $P_{n-2}$" accounts for the effects of the pulse 604. Sample "c" of pulse 604 occurs at the same time as sample "b" of pulse 602. Therefore, if there was a peak detected at time n−2, i.e. $p_{n-2}$ is one, the phase error is corrected by adding a constant value c to offset the "c" sample of pulse 604. This constant value is determined by calibration of the device and is input to the circuit through the interface 116 (FIG. 1).

Similarly, a pulse could occur two sample times after pulse 602, represented in FIG. 6 by pulse 606. For this pulse, the "a" sample occurs at the same time as the "1" sample of pulse 602. Therefore, the phase error is corrected by subtracting a constant "a" if there is a pulse at time n+2, i.e. if $p_{n+2}$ is one. This constant value is also determined by calibration of the device and input to the circuit through the interface 116 (FIG. 1).

The equation for side sample acquisition mode is similar to the side sample tracking mode equation, except that the corrections for the pulses 604 and 606 need not occur. These corrections are unnecessary, because in acquisition mode the data pattern is known, since the same preamble is written before every data record. Therefore, the entire compensation for asymmetry and intersymbol interference can be accomplished with a single term $t_a$. Table 2 shows nominal values for $t_a$ for the three types of acquisition patterns used in the present invention. This constant value is also determined by calibration of the device and input to the circuit through the interface 116 (FIG. 1).

FIG. 7 shows waveforms when center sampling is being used. Table 1 shows the center sampling equations, and the center sampled acquisition equation is very similar to side sampled acquisition equation, except that in center sampling the "b" and "c" samples of each pulse are used to determine phase error. Therefore, the center sampled acquisition equation substitutes $y_n$ for the $y_{n-1}$ in the side sampled acquisition equation.

The center sampled tracking equation incorporates the same kind of adjustments that were incorporated into the side sampled tracking equation, but the details differ. As shown in FIG. 7, a pulse 704 can overlap the pulse 702, and if this occurs, the "c" sample of pulse 704 overlaps the "b" sample of pulse 702. Therefore, the center sampled tracking equation adds the term "+c * $p_{n-2}$" to compensate for the pulse 704, where c is the same constant described for the side sampling equations. Similarly, pulse 706 can overlap pulse 702 and the center sampled tracking equation adds the term "−b * $p_{n+2}$" to compensate for the pulse 706, where b is a constant value determined by calibration of the device and input to the circuit through the interface 116 (FIG. 1).

In center sampling, a third pulse, 708, can also overlap the pulse 702. One possible way to compensate for the pulse 708 would be to subtract a constant "a" times $p_{n+3}$. However, this requires that the detector wait at least three sample times before determining the phase error for the pulse 702. As shown in FIG. 7, the value of the "a" sample for pulse 708 will typically be very small for center sampling. Because it is very small, this term of the equation can be deferred to a later clock cycle without much consequence. When deferred by three sample times, the correction "−a * $p_{n+3}$" may be included in the phase error equation for the next pulse (at time n+3), at which time it is included as "−a * $P_{n-3}$". Therefore, the center sampled tracking equation includes the term "−a * $p_{n-3}$" to provide compensation for pulse 708.

Figure 8:
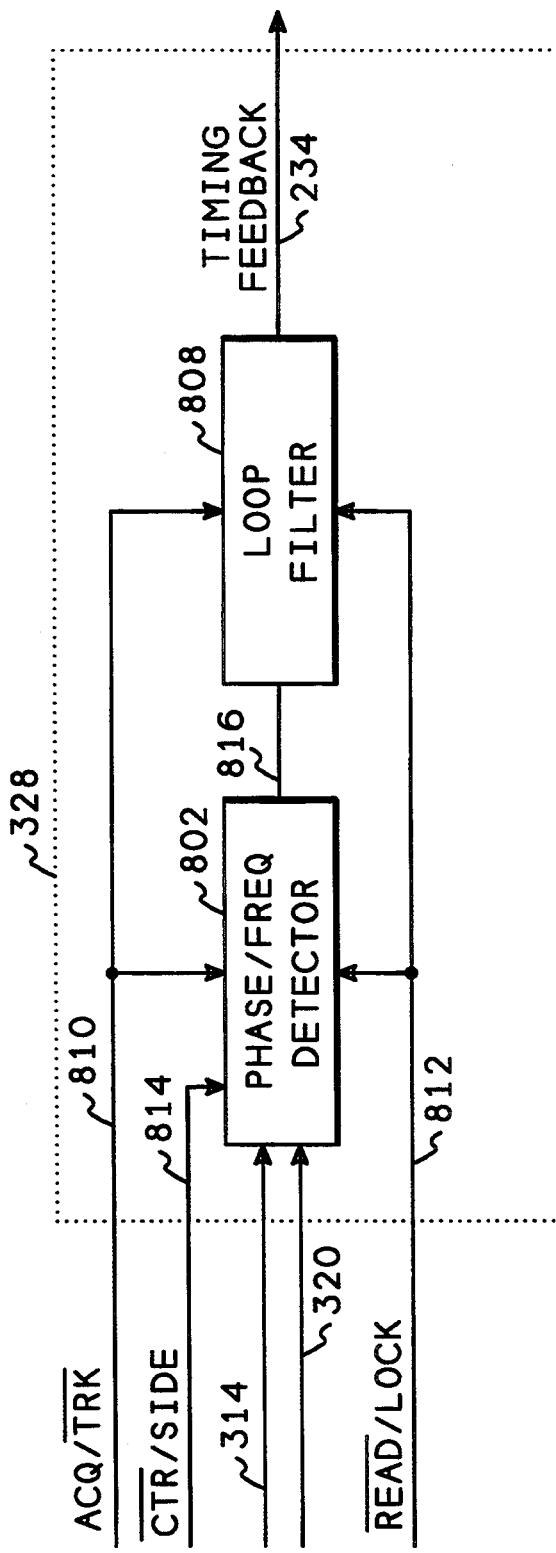
FIG. 8 shows a block diagram of the timing recovery circuit of FIG. 3.

FIG. 8 shows a block diagram of the timing recovery circuit 328 of FIG. 3. Referring now to FIG. 8, the timing recovery circuit 328 is shown having a phase/frequency detector 802 which is connected to a loop filter 808 to provide the timing feedback signal 234. The phase/frequency detector 802 receives the output 314 of the pulse detector 312 (FIG. 3). As discussed above and shown in the equations of Table 1, this is the signal "P". The phase/frequency detector 802 also receives the data samples 320 which may have been selected from the raw data samples 230 or after being delayed by the delay 304 or filtered by the digital filter 302. In addition, the phase/frequency detector 802 receives an acquisition/tracking signal 810 which tells the phase/frequency detector 802 whether acquisition or tracking mode is being used. Also, a read/lock signal 812 tells the phase/frequency detector whether data is being read from the system, or whether the detector is in lock to reference mode.

Lock to reference mode is used to set the frequency of the VFO 222 (FIG. 2) at a nominal frequency when data is not being read and thus minimize the initial frequency error when reading of data is started. This is accomplished by creating a periodic reference signal at a precisely controlled frequency equal to one fourth of the nominal sample rate. This signal is connected through analog multiplexer 203 (FIG. 2), into the normal data path. Thus, when not reading data, this reference signal may be used to set the VFO at the nominal frequency.

Table 3 shows the equation for the frequency detection, when the phase/frequency detector 802 is acting as a frequency detector. This equation is very similar to the center sampled acquisition phase error equation, except that the sign of $y_n$ is reversed and the $t_a$ term is absent. If the VFO 222 is sampling at the correct frequency, every other sample will have the same magnitude, but opposite in sign. Therefore, if the VFO 222 is sampling at the correct frequency, $y_n + y_{n-2}$ will be zero. if the VFO is low in frequency, the result is negative, and if the VFO is high, the result is positive.

Figure 9:
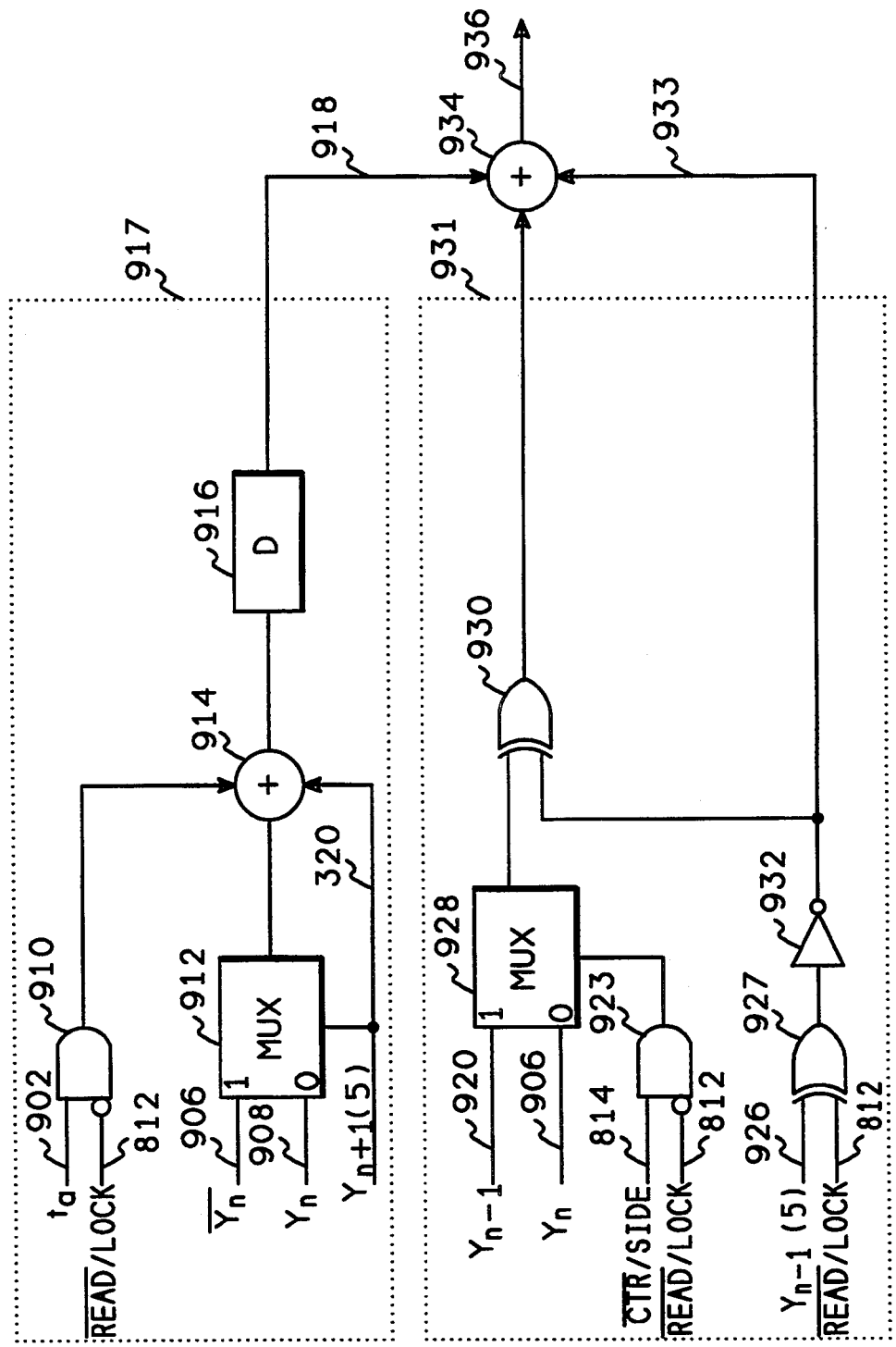
FIGS. 9–10 show a logic block diagram of the acquisition circuit of the phase and frequency detector of FIG. 8.
Figure 10:
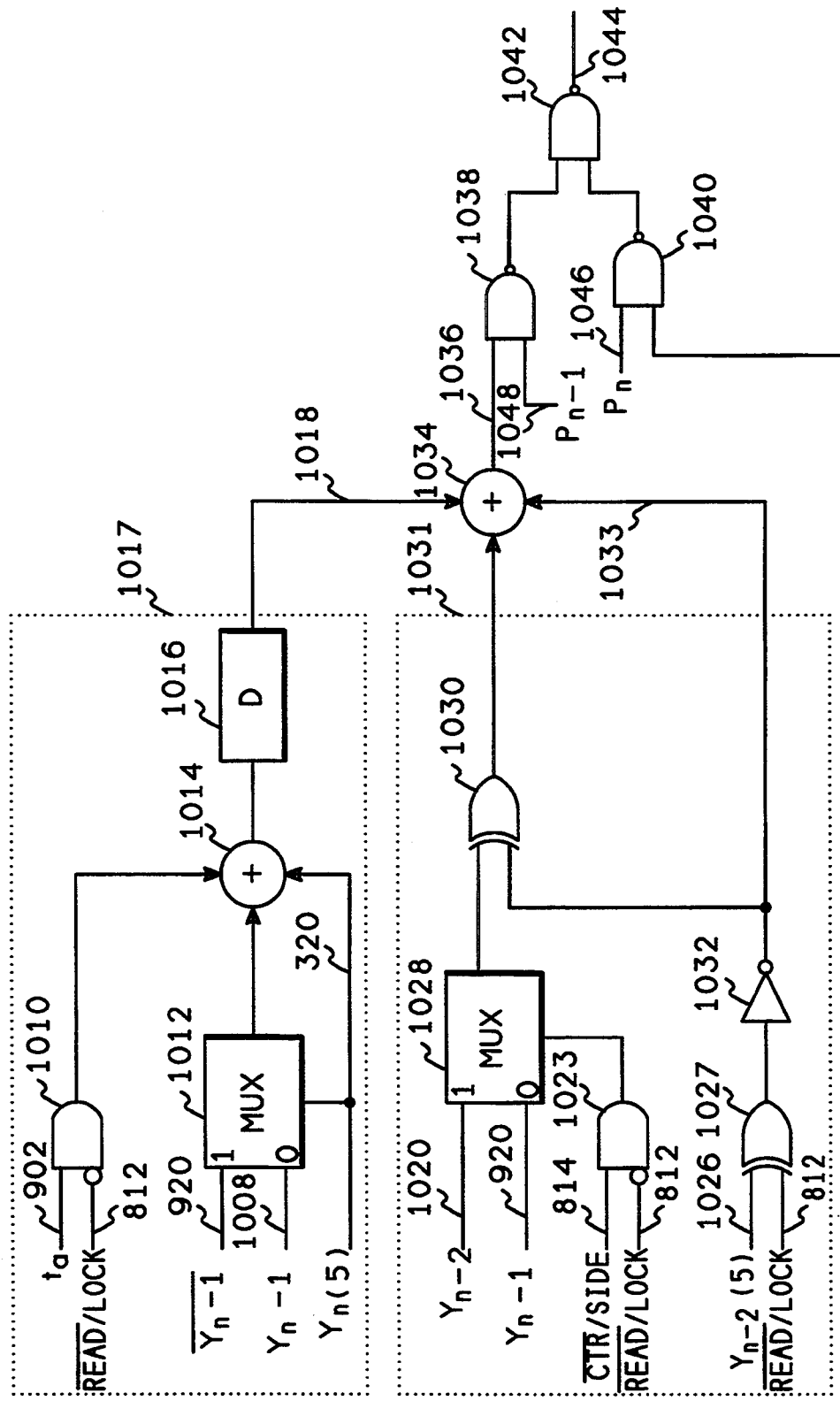
Figure 11:
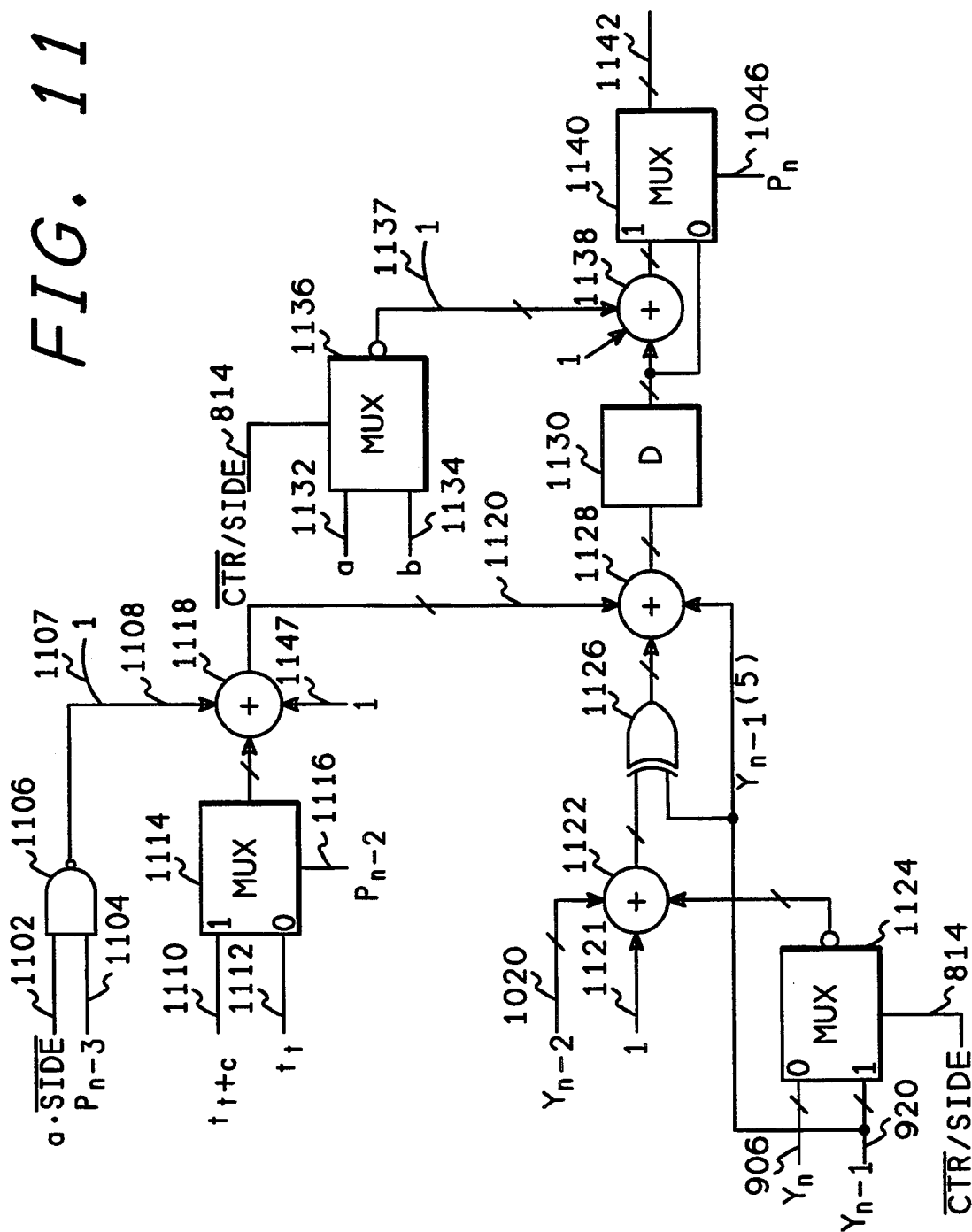
FIGS. 11–12 show a logic block diagram of the tracking circuit of the phase and frequency detector of FIG. 8.
Figure 12:
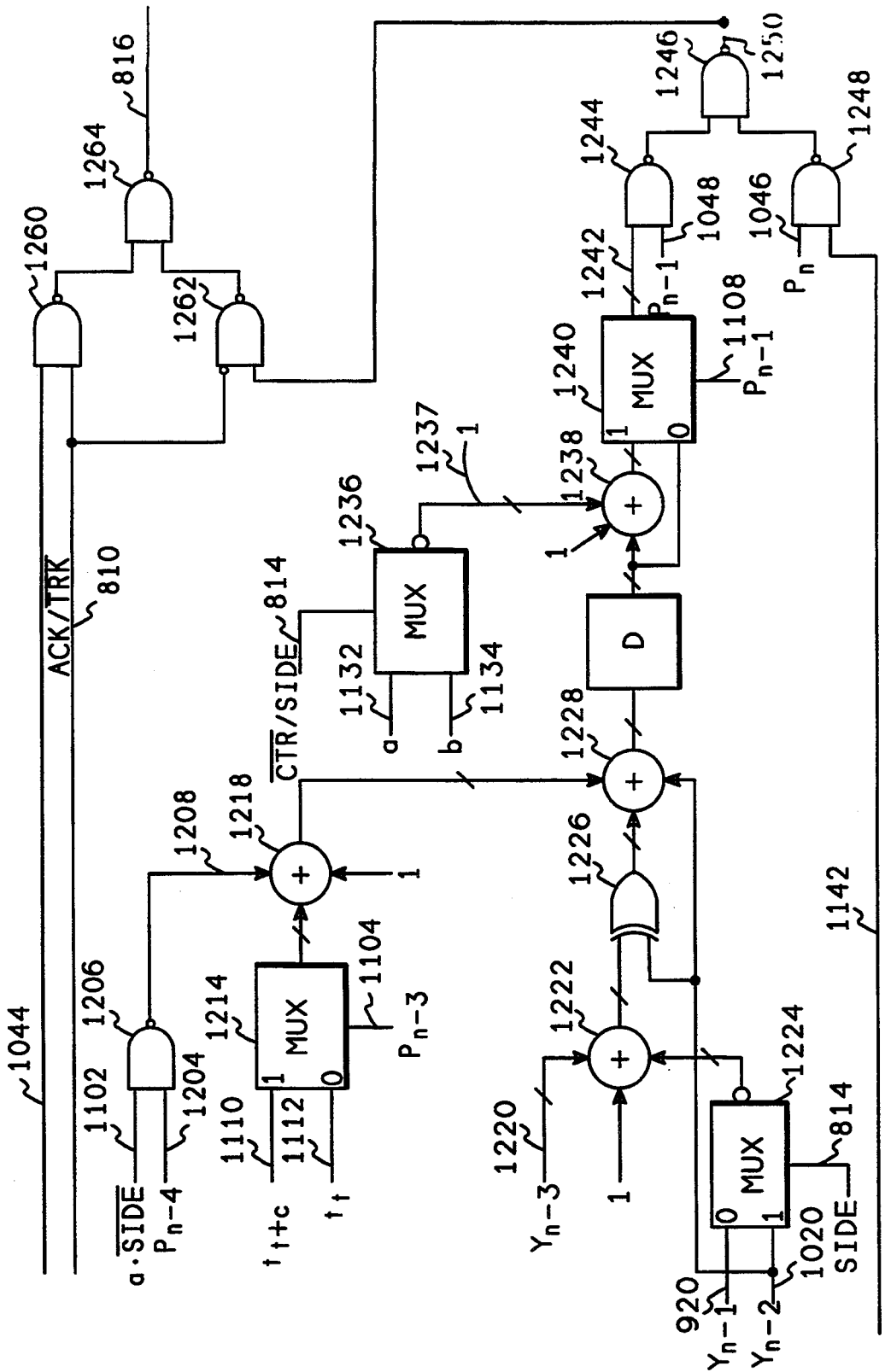

FIGS. 9-12 show a logic block diagram of the circuit for the phase/frequency detector 802. FIGS. 9-10 show the circuit for determining phase and frequency errors during acquisition mode, and FIGS. 11-12 show the circuit for determining phase errors in tracking mode. Frequency errors are only determined during acquisition mode. In the preferred embodiment of the present invention, two samples are processed simultaneously. FIG. 9 shows the processing of the first sample in acquisition mode, FIG. 10 shows the processing of the second sample in acquisition mode, and FIG. 10 also combines the results of FIG. 9 and 10 for acquisition mode. Similarly, FIG. 11 shows the processing of the first sample in tracking mode, FIG. 12 shows processing of the second sample in tracking mode, and FIG. 11 also combines the results of FIGS. 12 and 12 for tracking mode.

Referring now to FIG. 9, the circuits surrounded by dashed line 917 partially solves the equations for side and center sampling acquisition mode and frequency detection to produce the result of:

$$\text{SGN}(y_{n-1}) * y_{n-2} + t_a$$

for phase error detection and $$\text{SGN}(y_{n-1}) * y_{n-2}$$

for frequency detection.

Multiplexer 912 selects either $y_n$ or the inverted value of $y_n$ based on the sign of the data input $y_{n+1}$. Adder 914 then adds this result to $t_a$ for phase error detection or zero for frequency detection, and delay circuit 916 delays the result by two time periods so that signal 918 becomes SGN $(y_{n-1}) * y_{n-2} + t_a$ or SGN $(y_{n-1}) * y_{-2} + 0$.

The circuit surrounded by dashed line 931 produces the other part of the equation:

$$-\text{SGN}(y_{n-1}) * y_{n-1}$$

For side sampled acquisition and:

$$-\text{SGN}(y_n) * y_n$$

for center sampled acquisition mode and:

$$+\text{SGN}(y_{n-1}) * y_n$$

for frequency detect ion.

If side sampling read mode is being used, AND circuit 923 and multiplexer circuit 928 select $y_{n-1}$ for input to the EXCLUSIVE OR circuit 930. If center sampling or lock to reference mode is being used, these circuits select $y_n$ for input to the EXCLUSIVE OR circuit 930. EXCLUSIVE OR circuit 927 uses the sign bit, that is, bit five, of $y_{n-1}$ and the READ/LOCK signal 812 to determine whether the output of multiplexer 928 should be inverted and a sign bit of one input to adder 934. If read mode is being used and the sign of $y_{n-1}$ is positive, the output of multiplexer 928 is inverted and a sign bit of one is input to adder 934. If frequency mode is being used and the sign of $y_{n-1}$ is positive, the multiplexer output is not inverted, and a sign bit of zero is input to adder 934. The output of EXCLUSIVE OR circuit 930 and the output of inverter 932 are input to the adder 934 which adds the output of EXCLUSIVE OR circuit 930, and carry bit 933 to the signal 918 to produce the phase error or frequency error value on signal 936. Because of the EXCLUSIVE OR circuit 930 inverts the output of multiplexer 928, and inverter 932 creates a carry bit 933, adder 934 sometimes performs subtraction.

FIG. 10 performs the same function as FIG. 9 to produce a phase or frequency error signal 1036, however, it uses the previous sample as input, and then it combines the phase/frequency error outputs 936 of FIG. 9 and 1036 of FIG. 10.

The previous sample inputs to multiplexer 1012 are $y_{n-1}$ rather than the $y_n$ inputs to multiplexer 912, as are the inputs to multiplexer 1028 and EXCLUSIVE OR circuit 1027. The result is that signal 1036 is the phase/frequency error for the sample previous to the sample processed by FIG. 9. The circuits of FIG. 9 and FIG. 10, in combination, process two samples simultaneously.

After the two phase/frequency errors are determined, the NAND circuits 1038, 1040, and 1042 combine the signals to produce the output 1044 which is sent to FIG. 12 to be combined with the tracking mode signals before being sent to the loop filter 808. The NAND circuits 1038, and 1040 select either the output 936 from FIG. 9 or the output 1036 from FIG. 10 depending upon whether a pulse occurred at time n or at time n−1. These outputs are then connected to NAND circuit 1042 which produces the output 1044.

FIGS. 11-12 show the phase/frequency detector circuit for tracking mode. Referring now to FIG. 11, NAND circuit 1106 provides the term "$-a * p_{n-3}$" for center sampling. For side sampling the output of NAND circuit 1106 is zero. Multiplexer 1114 selects "$t_t + c * p_{n-2}$" if a pulse occurred at time n−2 or "$t_t$" alone if a pulse did not occur at time n−2. There are separate set points for acquisition mode and tracking mode. The term "$a * p_{n-3}$" is subtracted from the output of multiplexer 1114 by using the output of NAND gate 1106, which inverted the value of "a", and inserted a sign bit of one into the adder 1118 through signal 1107 as well as a carry bit of one through signal 1147. Therefore, signal 1120 represents "$t_t + c * p_{n-2} - a * p_{n-3}$", although the term "$-a * p_{n-3}$" will only be present for center sampling.

Multiplexer 1124 selects the value $y_n$ for center sampling and $y_{n-1}$ for side sampling and inverts the value before sending it to adder 1122. A carry bit of one is input to the adder 1122 through signal 1121 to cause either $y_n$ or $y_{n-1}$ to be subtracted from $y_{n-2}$, signal 1020. EXCLUSIVE OR circuit 1126 adjusts for the sign of $y_{n-1}$ and adder 1128 combines the result with signal 1120 to produce the partial equation:

$$\text{SGN } y_{n-1} * (y_{n-2} - y_n) + t_t + c * p_{n-2} - a * p_{n-3}$$

Although the term "$-a * p_{n-3}$" will only be present for center sampling. Delay circuit 1130 delays this result by two sample times and then adder circuit 1138 subtracts either the constant "a" for side sampling, or the constant "b" for center sampling, before sending the result to multiplexer 1140. Multiplexer 1140 selects either the output of delay circuit 1130 or the output of adder circuit 1138 depending upon whether a peak occurred at time n. Since delay circuit 1130 has delayed the output of adder 1128 by two clock cycles, signal $p_n$ 1046 actually represents $P_{n+2}$ and therefore determines whether the constant terms a or b should be added in. Therefore, output 1142 is the solution to the tracking equations of Table 1 for the current sample.

FIG. 12 is identical to the circuit of FIG. 11 except that the samples used are delayed by one, and additional circuitry exists to combine the two phase errors. For example, the inputs to multiplexer 1224 and adder 1222 are one sample behind the inputs to the equivalent circuits in FIG. 11 Therefore, the output 1242 provides the solution to the tracking equations of Table 1 delayed by one sample time.

FIG. 12 then combines the phase error results 1142 and 1242 of FIGS. 11 and 12, respectively, to provide the phase/frequency detector output 816 to the loop filter. The NAND circuits 1244 and 1248 select the output 1142 of FIG. 11 or the output 1242 of FIG. 12 depending upon whether a pulse occurred at time n−2 or time n−3. This result is sent to NAND circuit 1246 which produces the output 1250 which is combined with the acquisition mode signals before being connected to the loop filter.

NAND circuits 1260, 1262, and 1264 select the acquisition phase/frequency error signal 1052 or the tracking phase error signal 1250, depending upon the TRK/ACQ signal to create the phase/frequency circuit output 816 which is sent to the loop filter.

Figure 13:
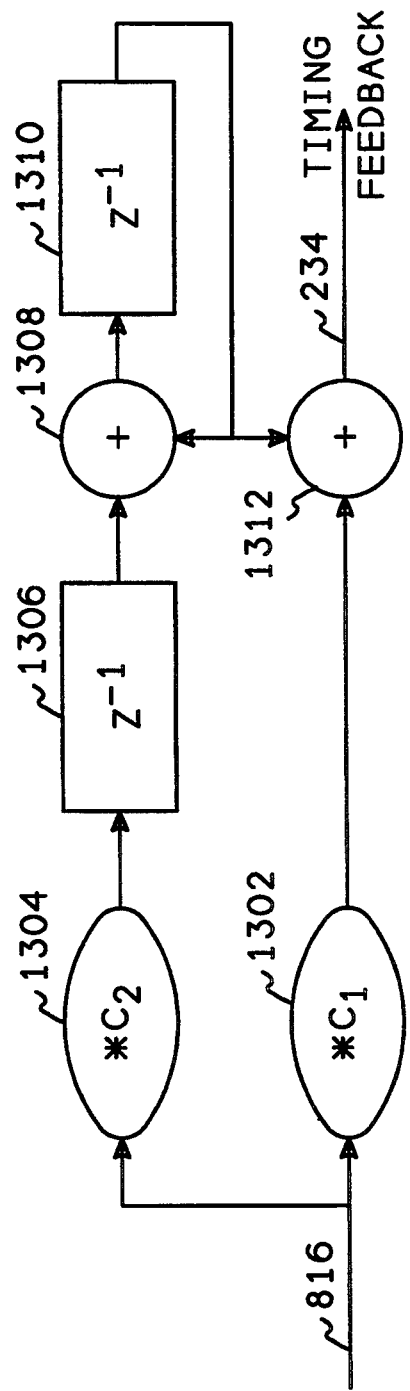
FIG. 13 shows a diagram of the loop filter circuit of the timing recovery block of FIG. 3.

FIG. 13 shows a diagram of the loop filter 808. The z-domain transfer function of this filter is $$F_t(z) = (c_1 * z * (z-1) + c_2)/(z * (z-1))$$

where $z^{-1}$ represents a delay of two channel bit intervals (each $1/f_s$) because this digital filter operates at one-half the channel sample rate. Coefficients $c_1$ 1302 and $c_2$ 1304 are independently programmable for acquisition and tracking. For lock to reference mode, $c_1$ is set to zero and $c_2$ is independently programmable. A means is also provided to change the significance of the loop filter output between acquisition and tracking modes since the appropriate range and resolution of frequency control depends on which mode is used. Separate registers are provided for each mode to facilitate this change. Delay element 1306 is used for pipelining and has little effect on the filter response.

A linear discrete-time approximation to the open-loop transfer function of the loop is $$G_t(z) = (K_p * K_o * (c_1 * z^2 - c_1 * z + c_2))/(z^{n+1} * (z-1)^2)$$

where $K_p$ is the gain of the phase detector (which depends upon the pulse shape), $K_o$ is the control gain of the VCO and n is the number of $(2/f_s)$ clock delays in the loop.

Having thus described a presently preferred embodiment of the present invention, it will now be appreciated that the aspects of the invention have been fully achieved, and it will be understood by those skilled in the art that many changes in construction and circuitry and widely differing embodiments and applications of the invention will suggest themselves without departing from the spirit and scope of the present invention. For instance the invention could be implemented with analog circuitry in place of much of the digital circuitry of the preferred embodiment. The disclosures and the description herein are intended to be illustrative and are not in any sense limiting of the invention, more preferably defined in scope by the following claims.

TABLE 1

|  | Acquisition | Tracking |
|---|---|---|
| Side Sampled | $SGN(Y_{n-1}) * (Y_{n-2} - Y_{n-1}) + t_a$ | $SGN(Y_{n-1}) * (Y_{n-2} - Y_{n-1}) + t_t + c*P_{n-2} - a*P_{n+2}$ |
| Center Sampled | $SGN(Y_{n-1}) * (Y_{n-2} - Y_n) + t_a$ | $SGN(Y_{n-1}) * (Y_{n-2} - Y_n) + t_t + c*P_{n-2} - b*P_{n+2} - a*P_{n-3}$ |

TABLE 2

|  | ACQUISITION PATTERN | NOMINAL $t_a$ | NOMINAL $t_t$ |
|---|---|---|---|
| Side Sampled | 1010 ... | $1 - b + c - a$ | $1 - b$ |
|  | 100100 ... | $1 - b$ |  |
|  | 10001000 ... | $1 - b$ |  |
| Center Sampled | 1010 ... | $2 * (c - b)$ | $c - b$ |
|  | 100100 ... | $c - b + a$ |  |
|  | 10001000 ... | $c - b$ |  |

TABLE 3

| Frequency Detector = $SGN(Y_{n-1}) * (Y_n + Y_{n-2})$ |
|---|

What is claimed is:

1. A phase detector for creating a phase error measurement signal representative of a difference in phase between a clock signal and pulses within an analog signal, said phase detector comprising:
   amplitude sampling means for receiving said analog signal and for taking a plurality of samples of an amplitude of said analog signal, said samples being taken at times determined by said clock signal;
   pulse detection means connected to an output of said amplitude sampling means, wherein said pulse detection means determines a location of each of said pulses;
   sample selection means connected to an output of said amplitude sampling means and an output of said pulse detection means, said sample selection means for selecting, for each pulse, at least two of said plurality of samples, wherein said at least two samples have a predetermined relationship to a location of said pulse;
   arithmetic means for combining said at least two selected samples to create said phase error measurement signal.

2. The phase detector of claim 1 wherein said sample selection means further comprises:
   means for selecting two samples for each of said pulses; and
   means for selecting a first of said two samples on a first side of said pulse, and a second of said two samples on a second side of said pulse.

3. The phase detector of claim 2 wherein said arithmetic means further comprises:
   means for subtracting said first sample from said second sample to create said phase error measurement signal; and
   means for negating said phase error measurement signal when a polarity of said pulse is negative.

4. The phase detector of claim 1 wherein said amplitude sampling means comprises analog to digital converter means.

5. The phase detector of claim 1 further comprising:
   means for storing at least one neighboring pulse compensation value, one said neighboring pulse compensation value corresponding to each neighboring pulse located within a predetermined distance to each of said pulses; and
   neighboring pulse arithmetic means for combining said at least one neighboring pulse compensation value with said phase error measurement signal when said corresponding neighboring pulse is present.

6. The phase detector of claim 1 further comprising:
   set point storage means for storing a constant value; and
   set point arithmetic means for combining contents of said set point storage means to said phase error measurement signal.

7. A phase locked loop for creating a clock signal in phase with pulses within an analog signal, said phase locked loop comprising:
   amplitude sampling means for receiving said analog signal and for taking a plurality of samples of an amplitude of said analog signal, said samples being taken at times determined by said clock signal;
   pulse detection means connected to an output of said amplitude sampling means, wherein said pulse detection means determines a location of each of said pulses;
   sample selection means connected to an output of said amplitude sampling means and an output of said pulse detection means, said sample selection means for selecting, for each pulse, at least two of said plurality of samples, wherein said at least two samples have a predetermined relationship to a location of said pulse;
   arithmetic means for combining said at least two selected samples to create a phase error measurement signal.
   clock signal generating means having an input connected to said phase error measurement signal, and having said clock signal as an output, wherein said phase error measurement signal controls said clock signal generating means to cause said clock signal output to sample said analog signal at a predetermined time relationship to a location of each of said pulses.

8. The phase locked loop of claim 7 further comprising filter means connected between said phase error measurement signal and said input of said clock generating means.

9. The phase locked loop of claim 7 wherein said amplitude sampling means comprises analog to digital converter means.

10. The phase locked loop of claim 9 wherein said clock generating means comprises variable frequency oscillator means, and wherein said phase error measurement signal adjusts a frequency of said variable frequency oscillator to cause said clock signal output to sample said analog signal at said predetermined time relationship to said location of each of said pulses.

11. The phase locked loop of claim 10 further comprising digital filter means connected between said phase error measurement signal and said input of said variable frequency oscillator.

12. A frequency detector for creating a frequency error measurement signal representative of a difference in frequency between a periodic analog signal waveform and a clock signal, said frequency detector comprising:
   amplitude sampling means for receiving said analog signal and for taking a plurality of samples of an amplitude of said analog signal, said samples being taken at times determined by said clock signal;
   sample selection means connected to an output of said amplitude sampling means, said sample selection means for selecting two of said plurality of samples separated by a predetermined number of samples;
   arithmetic means for combining said two selected samples to create said frequency error measurement signal, said arithmetic means comprising
   means for adding a first of said two samples to a second of said two samples to create said frequency error measurement signal, and
   means for negating said frequency error measurement signal when a value of said periodic waveform at a predetermined time between said selected samples is less than a predetermined threshold.

13. A frequency locked loop for locking the frequency of a clock signal to a predetermined multiple of the frequency of a periodic input waveform signal, said frequency locked loop comprising:
   amplitude sampling means for receiving said periodic input waveform signal and for taking a plurality of samples of an amplitude of said periodic input waveform signal, said samples being taken at times determined by said clock signal;
   sample selection means connected to an output of said amplitude sampling means, said sample selection means for selecting two of said plurality of samples separated by a predetermined number of samples;
   arithmetic means for combining said two selected samples to create a frequency error measurement signal, said arithmetic means comprising
   means for adding a first of said two samples to a second of said two samples to create said frequency error measurement signal, and
   means for negating said frequency error measurement signal when a value of said periodic waveform at a predetermined time between said selected samples is less than a predetermined threshold;
   variable frequency oscillator means having an input connected to said frequency error measurement signal, and having said clock signal as an output, wherein said frequency error measurement signal adjusts a frequency of said variable frequency oscillator to cause said clock signal output to sample said periodic input waveform signal at said predetermined multiple of the frequency of said input periodic waveform signal.

14. The phase detector of claim 13 further comprising digital filter means connected between said phase error measurement signal and said input of said variable frequency oscillator.

15. A timing recovery circuit for determining a clock signal from a data signal from a data storage device or a data signal from a data communications device, said timing recovery circuit comprising:
   multiplexer means connected to said data signal and a predetermined frequency periodic waveform signal;
   signal selection means connected to said multiplexer means for causing said multiplexer means to select either said data signal or said predetermined frequency periodic waveform signal for output;
   amplitude sampling means connected to receive said output of said multiplexer means, said amplitude sampling means for taking a plurality of samples of said output of said multiplexer means, said samples being taken at times determined by said clock signal;
   pulse detection means connected to an output of said amplitude sampling means, wherein said pulse detection means determines a location of pulses contained in said data signal when said signal selection means causes said multiplexer means to select said data signal;
   sample selection means connected to said pulse detection means and connected to an output of said amplitude sampling means, wherein said sample selection means selects two samples for each pulse in said data signal when said signal selection means causes said multiplexer means to select said data signal, said two samples having a predetermined relationship to a location of said pulse, and wherein said sample selection means selects two samples of said predetermined frequency periodic waveform signal when said signal selection means causes said multiplexer means to select said predetermined frequency periodic waveform signal, said samples being separated by a predetermined number of periods of said clock signal;
   arithmetic means for combining said two selected samples to create an error measurement signal; and
   variable frequency oscillator means having an input connected to said error measurement signal, and having said clock signal as an output, wherein said error measurement signal adjusts a frequency of said variable frequency oscillator to cause said clock signal output to sample said predetermined frequency periodic waveform signal at a predetermined time relationship to said output of said multiplexer means.

* * * * *